United States Patent
Akagi

(10) Patent No.: US 8,790,944 B2
(45) Date of Patent: Jul. 29, 2014

(54) MANUFACTURING METHOD OF SEMICONDUCTOR ELEMENT

(75) Inventor: Takanobu Akagi, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 173 days.

(21) Appl. No.: 13/423,571

(22) Filed: Mar. 19, 2012

(65) Prior Publication Data

US 2012/0244683 A1  Sep. 27, 2012

(30) Foreign Application Priority Data

Mar. 22, 2011  (JP) ................. 2011-062940

(51) Int. Cl.
*H01L 21/00*  (2006.01)

(52) U.S. Cl.
USPC ........................................... 438/45

(58) Field of Classification Search
None
See application file for complete search history.

(56) References Cited

U.S. PATENT DOCUMENTS

| 8,004,006 B2 | 8/2011 | Nakahara et al. |
| 2010/0248407 A1* | 9/2010 | Umemura et al. ............ 438/45 |
| 2010/0258818 A1* | 10/2010 | Lee et al. ...................... 257/79 |

FOREIGN PATENT DOCUMENTS

JP  2007-134415 A  5/2007

* cited by examiner

*Primary Examiner* — Charles Garber
*Assistant Examiner* — Andre' C Stevenson
(74) *Attorney, Agent, or Firm* — Holtz Holtz Goodman & Chick PC

(57) ABSTRACT

A manufacturing method of a semiconductor element comprises the steps of (a) preparing a growth substrate, (b) forming a semiconductor layer on the growth substrate, (c) dividing the semiconductor layer into a plurality of elements while leaving at least a part of the semiconductor layer between each element to form a sacrificial layer around each element, (d) forming a metal layer on the semiconductor layer, (e) bonding a supporting substrate to the semiconductor layer via the metal layer, and (f) removing the growth substrate from the semiconductor layer by irradiating a laser whose area of irradiation covers each element within an outline of the sacrificial layer of each element.

4 Claims, 9 Drawing Sheets

US 8,790,944 B2

MANUFACTURING METHOD OF SEMICONDUCTOR ELEMENT

This application is based on Japanese Patent Application 2011-062940, filed on Mar. 22, 2011, the entire contents of which are incorporated herein by reference.

BACKGROUND OF THE INVENTION

A) Field of the Invention

This invention relates to a manufacturing method of a semiconductor element.

B) Description of the Related Art

It has bee widely practiced that a GaN based light emitting diode is formed on a sapphire substrate. The sapphire substrate is insulative and has relatively low thermal conductivity; therefore, a GaN based light emitting diode from which a sapphire substrate is removed has been manufactured. Sapphire is transparent, and light in the ultraviolet region which a GaN based semiconductor absorbs passes through it. Therefore, a laser lift off (LLO) process for removing a sapphire substrate by using ultraviolet laser has been widely used.

A GaN based semiconductor layer is grown on a sapphire substrate, and a supporting substrate such as a Si substrate is bonded to a surface of the GaN based semiconductor layer via a bonding metal layer made of eutectic alloys or the like. Thereafter the sapphire substrate is removed by irradiating a laser from a side of the sapphire substrate. By the irradiation of the laser, the GaN based semiconductor is decomposed at an interface between the sapphire substrate and the GaN based semiconductor layer, and Ga metal and $N_2$ gas are generated. By the generation of N2 gas, the sapphire substrate is removed. In case that the GaN based semiconductor layer is formed widely over the sapphire substrate, a pressure of the generated $N_2$ gas may be high because it may be sealed locally. It has been well-known that the generation of high-pressure $N_2$ gas may destruct a wide area of the GaN based semiconductor layer.

It has been suggested that the GaN based semiconductor layer grown on the sapphire substrate is divided into chip regions and removed from regions between chips in order to avoid the destruction of the GaN based semiconductor layer by the generation of the high-pressure $N_2$ gas. For example, an n-type GaN based semiconductor layer, a GaN based semiconductor active layer and a p-type GaN based semiconductor layer are laminated on a sapphire substrate, masks each covering a chip region are formed, a street region where a surface of the sapphire substrate is exposed is formed by etching the GaN based semiconductor lamination, a supporting substrate such as a Si substrate or the like is bonded to the GaN based semiconductor lamination via a bonding metal layer made of eutectic alloys or the like, and thereafter the sapphire substrate is removed by irradiating a laser from a side of the sapphire substrate. By that, the sapphire substrate can be removed without destructing the semiconductor lamination.

In the above technique, the semiconductor lamination is removed from the street region and so the laser irradiates the bonding metal layer on the supporting substrate and laser ablation occurs. Metal vapored by the laser ablation deposits on a side of a chip, and it causes a short circuit and leakage (for example, refer to Japanese Laid-Open Patent No. 2007-134415).

Therefore, it has been suggested that chips are separated by forming a wide isolation trench (street) demarcating chip regions by etching a half of the thickness of the semiconductor lamination, depositing an insulating layer on side walls of the wide street region and forming a narrow isolation trench (street) piercing the semiconductor lamination to the surface of the substrate from a bottom surface of the wide street region by etching, and thereafter the sapphire substrate is removed by the laser lift off process.

According to the prior art, the periphery of each chip is etched until the growing substrate is exposed before the LLO process and so the laser is irradiated to the bonding metal layer (AuSn, etc.) on the supporting substrate at the LLO process. The light of 248 nm wavelength almost completely passes through the sapphire substrate; therefore, a region (street region) without the GaN layers is irradiated by the laser and so metal is sputtered from the bonding metal layer in the street region and adheres to side walls of the element, which may cause leakage and a short circuit.

SUMMARY OF THE INVENTION

It is an object of the present invention to provide a manufacturing method of a semiconductor element which increases yields.

According to one aspect of the present invention, there is provided a manufacturing method of a semiconductor element, comprising the steps of: (a) preparing a growth substrate; (b) forming a semiconductor layer on the growth substrate; (c) dividing the semiconductor layer into a plurality of elements while leaving at least a part of the semiconductor layer between each element to form a sacrificial layer around each element; (d) forming a metal layer on the semiconductor layer; (e) bonding a supporting substrate to the semiconductor layer via the metal layer; and (f) removing the growth substrate from the semiconductor layer by irradiating a laser whose area of irradiation covers each element within an outline of the sacrificial layer of each element.

According to the present invention, it can be provided a manufacturing method of a semiconductor element which increases yields.

DESCRIPTION OF THE PREFERRED EMBODIMENTS

A method of manufacturing a semiconductor element according to an embodiment of the present invention includes a semiconductor growing process, a two-step isolation process, a protection film formation process, a p-electrode formation process, a supporting body formation process, a growth substrate removing process, an n-electrode formation process and a chipping process. The below explains a manufacturing method of a nitrogen compound semiconductor light emitting element (LED element) using a sapphire substrate 1 as a growth substrate with reference to FIGS. 1 to 11.

Figure 1:
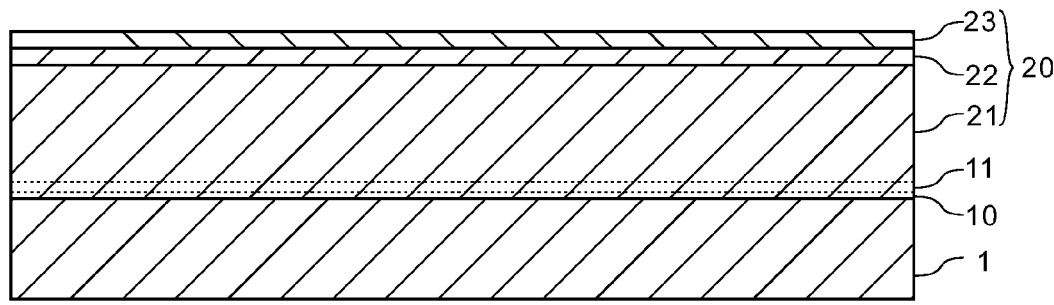
FIG. 1 is a schematic cross sectional view of a semiconductor element for explaining a semiconductor growing process according to an embodiment of the present invention.

FIG. 1 is a schematic cross sectional view of a semiconductor element for explaining the semiconductor growing process according to the embodiment of the present invention.

At first, a growth substrate (C plane sapphire substrate) on which $Al_xIn_yGa_zN$ ($0 \leq x \leq 1$, $0 \leq y \leq 1$, $0 \leq z \leq 1$, $x+y+z=1$) can be grown is prepared. Then a semiconductor layer 20 including a buffer layer 10, a GaN base layer 11, an n-type GaN layer 21, an active layer 22 and a p-type GaN layer 23 is formed on the growth substrate by metal organic chemical vapor deposition (MOCVD).

For example, the sapphire substrate 1 is put into a MOCVD device and heated in hydrogen atmosphere for 10 minutes at 1000 degrees Celsius (thermal cleaning). Next, 10.4 μmol/min of trimethylgallium (TMG) and 3.3 LM of $NH_3$ are supplied for three minutes at about 500 degrees Celsius to form the low temperature buffer layer (GaN layer) 10. Then, the temperature is increased and maintained at 1000 degrees Celsius for 30 seconds to crystallize the low temperature buffer layer 10. Continuously, at the same temperature, 45 μmol/min of TMG and 4.4 LM of $NH_3$ are supplied for 20 minutes to form the base GaN layer 11 with a thickness of about 1 μm. Thereafter, 45 μmol/min of TMG, 4.4 LM of $NH_3$ and $2.7 \times 10^{-9}$ μmol/min of $SiH_4$ are supplied for 120 minutes at 1000 degrees Celsius to grow the n-type GaN layer (n-type semiconductor layer) 21 with a thickness of about 7 μm.

The active layer 22 has, for example, a multi quantum well structure made of InGaN/GaN. In this embodiment, five periods of InGaN/GaN are grown. In each period, an InGaN well layer with a thickness of about 2.2 nm is grown by supplying 3.6 μmol/min of TMG, 10 μmol/min of trimethylindium (TMI) and 4.4 LM of $NH_3$ for 33 seconds at about 700 degrees Celsius and then a GaN barrier layer with a thickness of about 15 nm is grown by supplying 3.6 μmol/min of TMG and 4.4 LM of $NH_3$ for 320 seconds. By repeating this period for five times, the active layer 22 is formed.

Next, a p-AlGaN cladding layer with a thickness of about 40 nm is grown by supplying 8.1 μmol/min of TMG, 7.5 μmol/min of trimethylaluminium (TMA), 4.4 LM of $NH_3$ and $2.9 \times 10^{-7}$ μmol/min of $CP_2Mg$ for five minutes at 870 degrees Celsius. Thereafter, the p-GaN layer with a thickness of about 150 nm is grown by supplying 18 μmol/min of TMG, 4.4 LM of $NH_3$ and $2.9 \times 10^{-7}$ μmol/min of $CP_2Mg$ for seven minutes at 870 degrees Celsius to form the p-type GaN layer 23.

FIGS. 2A and 2B and FIGS. 3A and 3B are schematic cross sectional views of the semiconductor element for explaining the two-step isolation process according to the embodiment of the present invention.

Figure 2A:
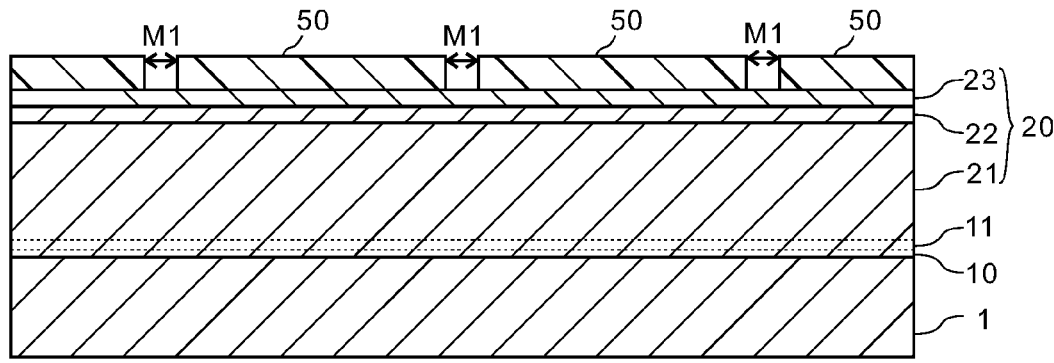
FIGS. 2A and 2B are schematic cross sectional views of the semiconductor element for explaining a first step of a two-step isolation process according to the embodiment of the present invention.
Figure 2B:
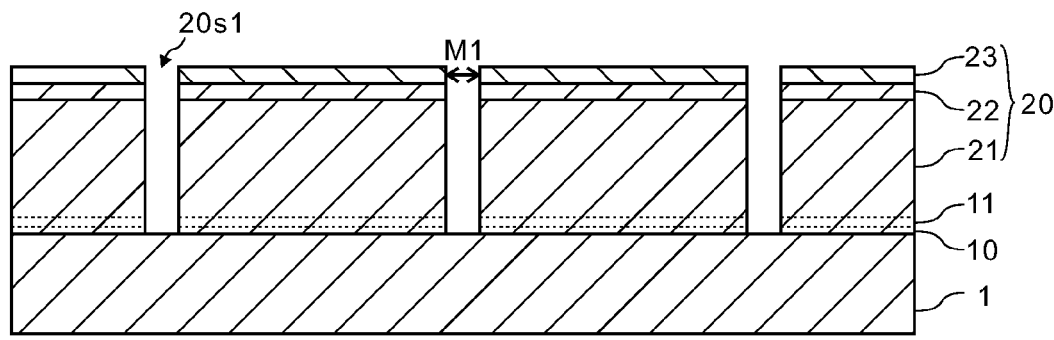

FIGS. 2A and 2B are schematic cross sectional views of the semiconductor element for explaining a first step of the two-step isolation process according to the embodiment.

First, a resist mask 50 having openings corresponding to street regions 20s1 with a width of M1 is formed by using photolithography or the like to have the semiconductor element as shown in FIG. 2A. Then, the sapphire substrate 1 is put into a reactive ion etching (RIE) device, and a dry-etching process using $Cl_2$ plasma is performed to the epitaxial layer (the buffer layer 10, the base GaN layer 11 and the semiconductor layer 20) on the street regions 20s1 until a surface of the sapphire substrate is exposed to make the semiconductor element in a condition shown in FIG. 2B.

Figure 3A:
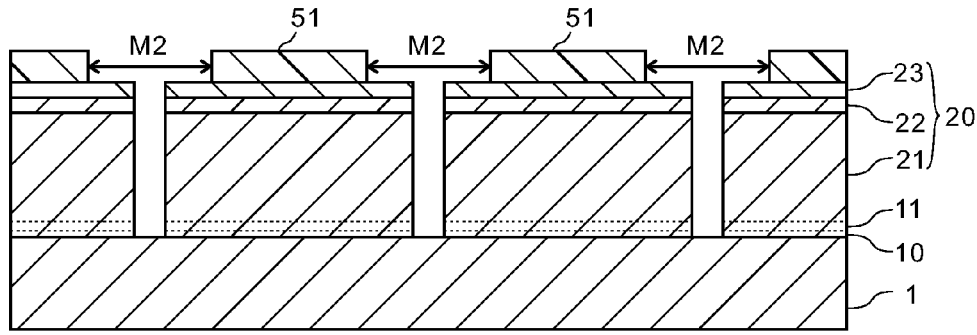
FIGS. 3A and 3B are schematic cross sectional views of the semiconductor element for explaining a second step of the two-step isolation process according to the embodiment of the present invention.
Figure 3B:
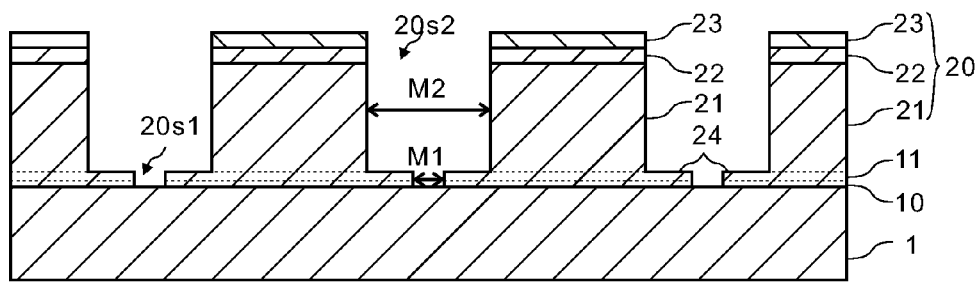

FIGS. 3A and 3B are schematic cross sectional views of the semiconductor element for explaining a second step of the two-step isolation process according to the embodiment.

A resist mask 51 having openings surrounding the street region 20s1 formed at the first step and corresponding to street regions 20s2 with a width of M2 that is wider than the width M1 of the street region 20s1 is formed as shown in FIG. 3A by using photolithography or the like. A distance between the edge of the street region 20s1 and the edge of the opening of the resist mask 51 is set to 10-20 μm. Thereafter, the sapphire substrate 1 is put into the RIE device, and a dry-etching process using $Cl_2$ plasma is performed to the epitaxial layer (the buffer layer 10, the base GaN layer 11 and the semiconductor layer 20) exposed from the openings of the resist mask 51 until a thickness of the epitaxial layer becomes about 1 μm to leave a laser lift off (LLO) region (sacrificial layer) 24 around a chip region 2 (refer to FIG. 7). The thickness of the sacrificial layer is preferably not thicker than ⅛ of the thickness of the semiconductor layer 20 or not thicker than 2 μm.

The sequential order of the first step and the second step may be reversed. That is, the second step may be performed before the first step. In this case, for example, first, the resist mask 51 having the openings corresponding to the street regions 20s2 with the width of M2 is formed and the epitaxial layer (the buffer layer 10, the base GaN layer 11 and the semiconductor layer 20) is etched to make the thickness of the epitaxial layer about 1 μm, and then, the resist mask 50 having the openings corresponding to the street regions 20s1 with the width of M1 is formed on the epitaxial layer remaining in the street region 20s2 and the epitaxial layer exposed from the openings is etched until the surface of the sapphire substrate 1 exposes.

In this embodiment, although a vertical etching is performed, the etched sidewalls may be inclined surfaces. In this case, the sidewalls of the semiconductor layer 20 are inclined and the inclined surfaces become as steep as about 50-90 degrees. Because the LLO sacrificial layer has an almost plain surface, an inclination angle changes at the boundary of the LLO sacrificial layer 24 and the sidewall of the semiconductor layer 20. This shape of the boundary remains the same in either case that the first step or the second step is performed first.

Figure 4:
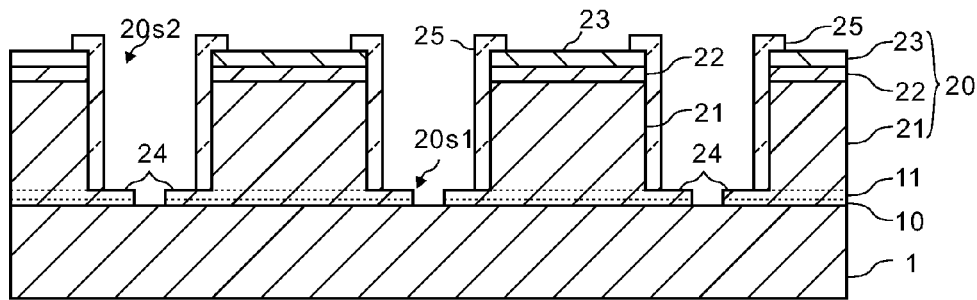
FIG. 4 is a schematic cross sectional view of the semiconductor element for explaining a protection film formation process according to the embodiment of the present invention.

FIG. 4 is a schematic cross sectional view of the semiconductor element for explaining the protection film formation process according to the embodiment of the present invention.

First, resist masks are formed on regions where electrodes are formed and on regions around the chip where a protection film 25 is not formed by using photolithography or the like. Next, a $SiO_2$ film to be an insulator is formed by sputtering or the like. For example, a $SiO_2$ film with a thickness of 1000 to 6000 angstroms is formed to obtain electrical insulation, adhesion and strength. Thereafter, the protection film 25 of a desired shape is formed by removing the resist masks to lift-off the unnecessary part of the $SiO_2$ film. The $SiO_2$ film should completely cover the active layer 22 but not reach the sapphire substrate 1.

The protection film 25 may be shaped in the desired shape by a well-known wet-etching method using buffered hydrogen fluoride other than the above-described lift-off method. In case of using wet-etching, the $SiO_2$ film is formed first and then a resist pattern is formed on a region where the protection film 25 is formed, that is, the resist pattern having openings in regions where the $SiO_2$ film should be removed. Moreover, by using the above-described dry-etching process used in the isolation process, a desired patterned protection film 25 can be formed without under-etching that exposes the active layer 22.

Figure 5:
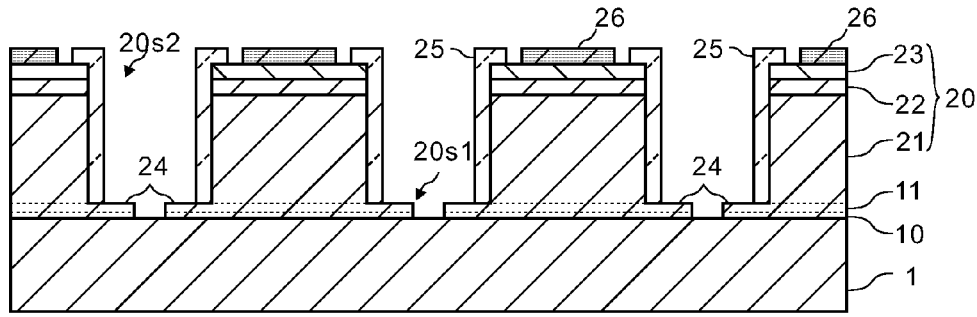
FIG. 5 is a schematic cross sectional view of the semiconductor element for explaining a p-electrode formation process according to the embodiment of the present invention.

FIG. 5 is a schematic cross sectional view of the semiconductor element for explaining the p-electrode formation process according to the embodiment of the present invention.

For each chip region 2, a p-electrode 26, also serving as a reflection layer, made of a lamination of 10 angstroms of Pt, 1500 angstroms of Ag, 1000 angstroms of Ti, 1000 angstroms of Pt and 2000 angstroms of Au is formed at a predetermined position on an exposing surface of the p-type semiconductor layer 23 by using photolithography and a electron beam evaporation technique. The formation of the p-electrodes 26 may be executed before the formation of the protection film 25 shown in FIG. 4. In that case, a resist mask or the like may be used according to necessity in consideration of previous and following processes.

Figure 6:
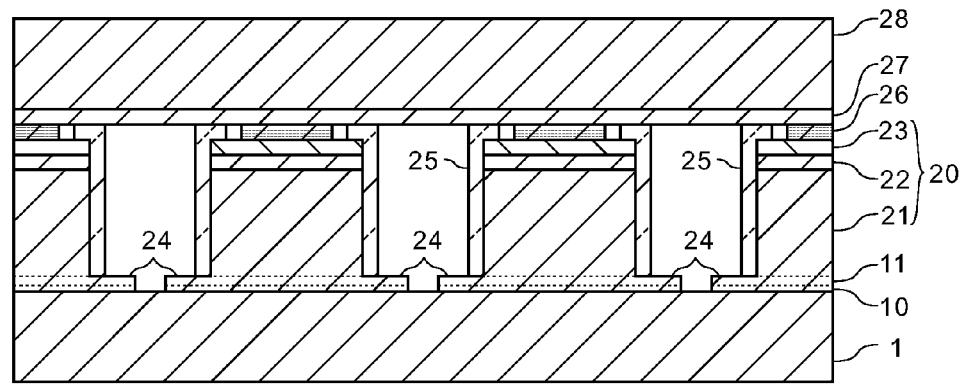
FIG. 6 is a schematic cross sectional view of the semiconductor element for explaining a supporting body formation process according to the embodiment of the present invention.

FIG. 6 is a schematic cross sectional view of the semiconductor element for explaining the supporting body formation process according to the embodiment of the present invention.

A silicon (Si) substrate 28 having an eutectic layer 27 made of AuSn on the outmost surface is prepared and bonded to the sapphire substrate 1 by facing the eutectic layer 27 with the Au layer of the p-electrode 26 by eutectic bonding (thermal compression bonding).

FIGS. 7 to 9B are schematic plan views and cross sectional views for explaining the growth substrate removing process according to the embodiment of the present invention.

Figure 7:
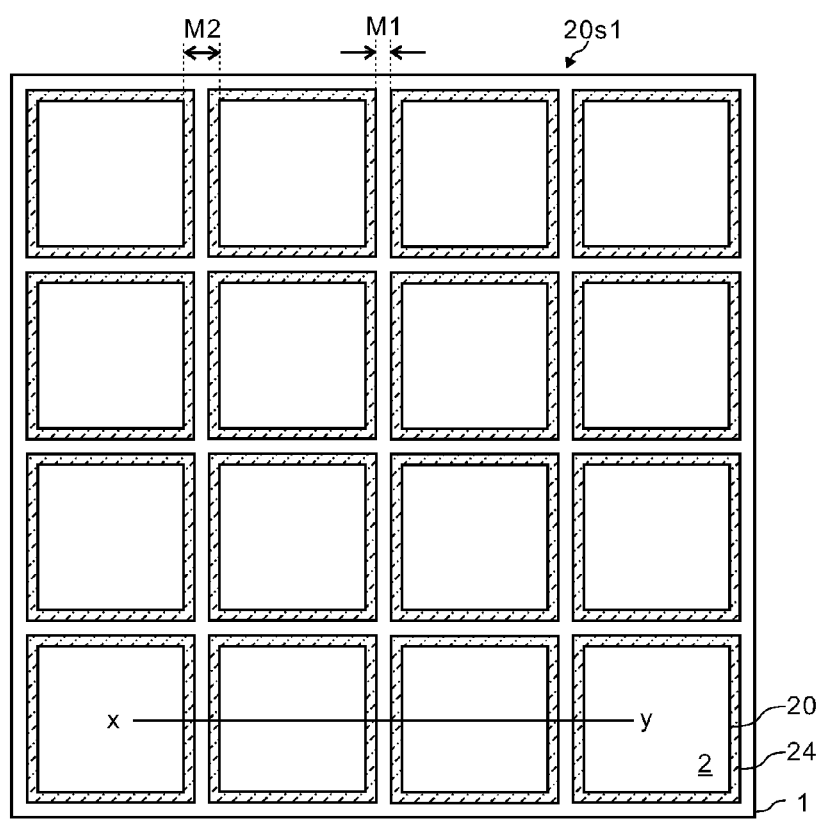
FIG. 7 is a schematic plan view of a sapphire substrate 1 at a growth substrate removing process according to the embodiment of the present invention.

FIG. 7 is a schematic plan view of the sapphire substrate 1 at the growth substrate removing process. A plurality of the chip regions 2 are formed on the sapphire substrate 1. The LLO sacrificial layer 24 is formed around each chip region 2. The width of the LLO sacrificial layer 24 (a distance between an edge of the chip region 2 and an edge of the sacrificial layer 24) is about 10~20 μm. The surface of the sapphire substrate 1 is exposed from the street region 20s1 with the width of M1 between each LLO sacrificial layer 24 surrounding each chip region 2.

Figure 8:
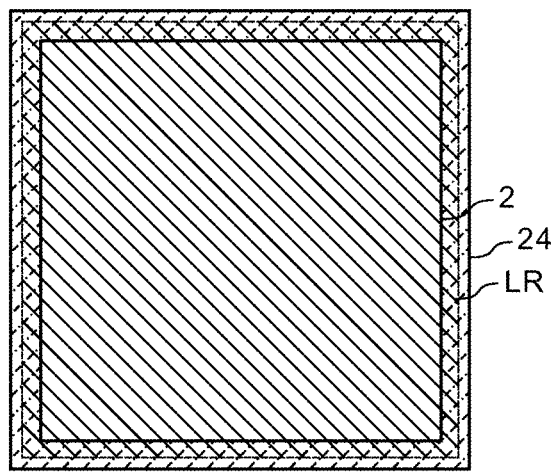
FIG. 8 is a schematic plan view of a chip region 2 for explaining the growth substrate removing process according to the embodiment of the present invention.
Figure 9A:
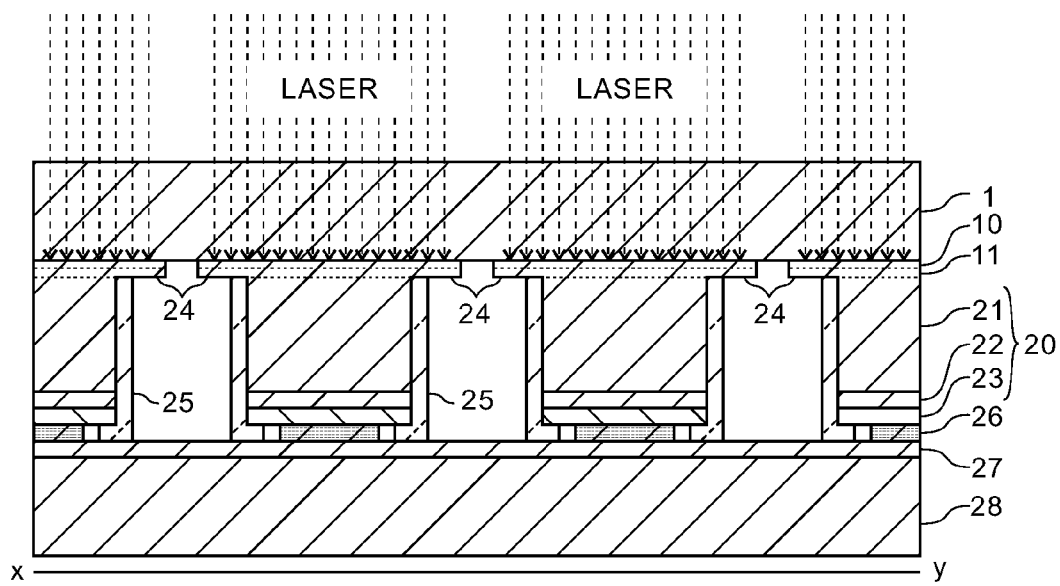
FIGS. 9A and 9B are schematic cross sectional views of the semiconductor element cut in the line x-y in FIG. 7 for explaining the growth substrate removing process according to the embodiment of the present invention.
Figure 9B:
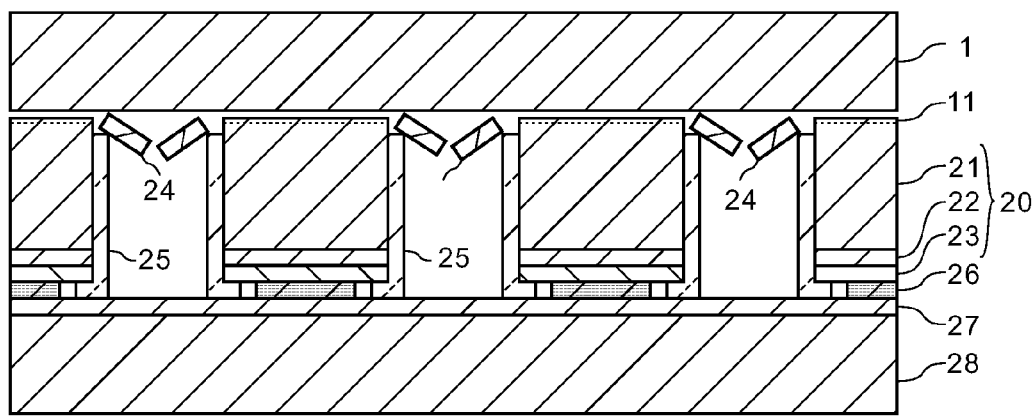

FIG. 8 is a schematic plan view of a chip region 2, and FIGS. 9A and 9B are schematic cross sectional views of the semiconductor element cut in the line x-y in FIG. 7.

In this growth substrate removing process, the sapphire substrate 1 is removed by the laser lift off (LLO) technique. In this embodiment, a KrF excimer laser with wavelengths of 248 nm at energy density of about 800 mJ/cm$^2$ is used. An irradiation area LR of the LLO process includes a whole area of the chip region 2 and at least part of the LLO sacrificial layer 24 as shown in FIG. 8. That is, the irradiation area LR is larger than the chip region 2 but smaller than an area demarcated by an outline of the LLO sacrificial layer 24 surrounding the chip region 2 (i.e., the area of the chip region 2<irradiation area LR<area demarcated by the outline of the sacrificial layer 24).

In FIG. 8, the LLO sacrificial layer 24 is formed around the rectangle shaped chip region 2 with the same or almost same widths (projecting the same or almost same distances outward from the edges of the chip region 2), and the irradiation area LR surrounds the chip region 2 with the same or almost same intervals from the edges of the chip region 2.

As shown in FIG. 9A, by irradiating the laser from a back (a surface on which the semiconductor layer 20, etc. are not formed) of the sapphire substrate 1, the GaN buffer layer 10 absorbs the laser and decomposed into Ga and $N_2$, and $N_2$ gas is generated. At that time, excessive stress of the $N_2$ gas is given to the LLO sacrificial layer 24.

Because the LLO sacrificial layer 24 is fragile and has a space on the other side of the sapphire substrate 1, boundaries of the chip region 2 and the sacrificial layer 24 are cracked and the sacrificial layer 24 is taken off from the semiconductor layer 20 of the chip region 2 by shock of the LLO process as shown in FIG. 9B. The GaN buffer layer 10 absorbs almost 100% of the KrF excimer laser with wavelengths of 248 nm; therefore, irradiation of the laser to the AuSn eutectic layer 27 can be prevented by making the irradiation area LR larger than the chip region 2 and smaller than the area demarcated by the outline of the LLO sacrificial layer 24 as shown in FIG. 8. Moreover, it is preferable to make the outline of the irradiation area outside the half of the width of the LLO sacrificial layer 24 for surely taking off the sacrificial layer 24.

Although mainly the n-type semiconductor layer 21 or the base GaN layer 11 is exposed after the removal of the sapphire substrate 1 because the GaN on the sapphire substrate 1 is decomposed into Ga and $N_2$, the n-type semiconductor layer 21 is regarded to be exposed for convenience of the explanation in this embodiment. The exposed surface after the LLO process may be polished if necessary. Moreover, the LLO sacrificial layer taken off from the chip region 2 can be easily removed by $N_2$ blow or ultrasonic cleaning.

Figure 10:
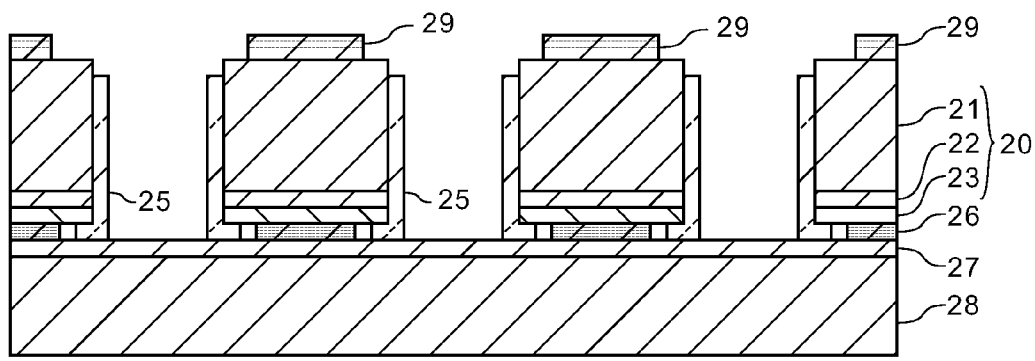
FIG. 10 is a schematic cross sectional view of the semiconductor element for explaining an n-electrode formation process according to the embodiment of the present invention.

FIG. 10 is a schematic cross sectional view of the semiconductor element for explaining the n-electrode formation process according to the embodiment of the present invention.

In this n-electrode formation process, a resist mask having an opening at a position where the n-electrode is formed is formed on the n-type semiconductor layer 20 of each chip region 2 by photolithography or the like, and an electrode metal layer (Ti/Al, etc.) is formed thereon by using the EB vapor deposition or the like. Thereafter, by the lift-off method, the n-electrode 29 is shaped in a desired pattern. Moreover, to improve in ohmic contact of the n-electrode 29, an alloying process is performed for 20 seconds at 500 degrees Celsius by using rapid thermal annealing (RTA).

Figure 11:
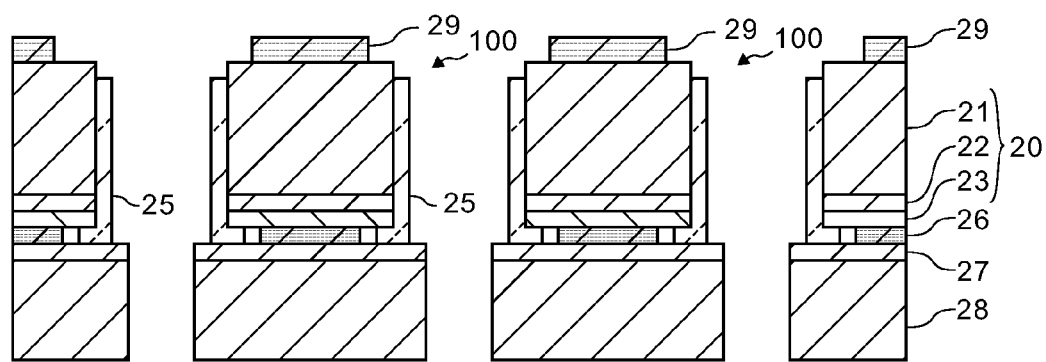
FIG. 11 is a schematic cross sectional view of the semiconductor element for explaining a chipping process according to the embodiment of the present invention.

FIG. 11 is a schematic cross sectional view of the semiconductor element for explaining the chipping process according to the embodiment of the present invention. After the formation of the p-electrode shown in FIG. 10, the Si substrate 28 with the eutectic layer 27 is chipped (divided into chips) by using laser scribing, dicing or the like as shown in FIG. 11. By that, the fabrication of the semiconductor element 100 is completed.

According to the embodiment of the present invention, the LLO sacrificial layer 24 is formed around the chip region 2, and the laser irradiation area LR is set to larger than the chip region 2 and smaller than the area demarcated by the outline of the LLO sacrificial layer 24. Therefore, sputtering of the fused metal layer (AuSn eutectic layer) 27 on the supporting body 28 by the LLO process can be prevented, and so a short circuit can be prevented and the yields can be increased.

Moreover, sputtering of AuSn, etc. on the sidewalls of the semiconductor element (chip) 100 can be prevented, so the chips can be manufactured without decreasing the yields. By that, adhesion of metals (AuSn or the likes), which is difficult to be removed, can be prevented all over the wafer.

Further, because the LLO sacrificial layer 24 is taken off by the shock of the LLO process, a position where a crack is generated is determined to the boundary of the LLO sacrificial layer 24 and the semiconductor layer 20; therefore, it is possible to avoid cracking of the semiconductor element (chip) 100.

Figure 12:
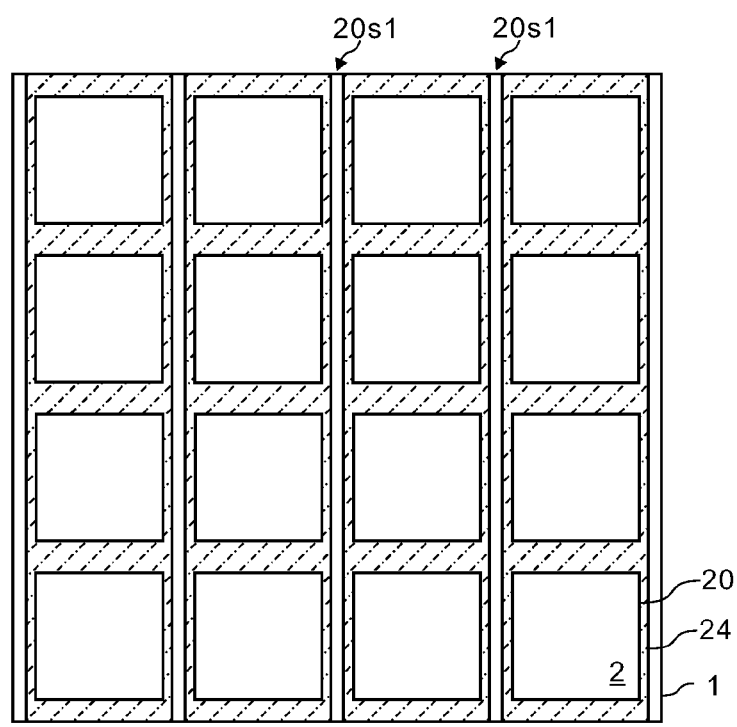
FIG. 12 is a schematic plan view of a sapphire substrate 1 according to a first modified example of the embodiment of the present invention.

Although the LLO sacrificial layer 24 surrounds each chip region 2 and the surface of the sapphire substrate 1 is exposed from the street region 20s1 with the width of M1 between each LLO sacrificial layer 24 of each chip region 2, the surface of the sapphire substrate 1 may be exposed only from a horizontal interval between horizontally adjacent LLO sacrificial layers 24 of the chip regions 2 as shown in FIG. 12. Moreover, the surface of the sapphire substrate 1 may be exposed only from a vertical interval between horizontally adjacent LLO sacrificial layers 24 of the chip regions 2 or from every two or more intervals between the chip regions 2. Furthermore, the surface of the sapphire substrate 1 may be exposed from every two horizontal intervals and from every two vertical intervals.

Figure 13:
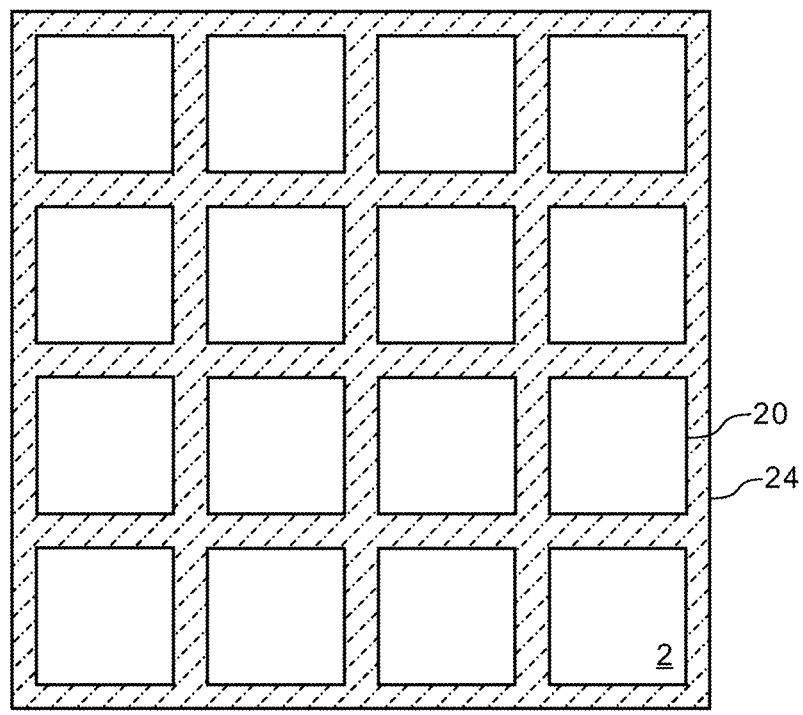
FIG. 13 is a schematic plan view of a sapphire substrate 1 according to a second modified example of the embodiment of the present invention.

Moreover, as shown in FIG. 13, the LLO sacrificial layer 24 can be formed to cover the whole surface of the sapphire substrate 1 exposed from the intervals between the chip regions. In this case, the first step of the two-step isolation process shown in FIGS. 2A and 2B is omitted, the resist mask having an opening corresponding to the street region 20s2 with the width of M2 as shown in FIG. 3A, and the epitaxial layer (the buffer layer 10, the base GaN layer 11 and the semiconductor layer 20) is etched until its thickness becomes about 1 μm. By that, it is not necessary to adjust the size of the irradiating laser at the LLO process to correspond with the size of each chip region 2, and the laser irradiation at the LLO process can be directed to the whole surface of the sapphire substrate 1.

Performing the LLO process decomposes the GaN based semiconductor and generates the gas; therefore, it is preferable to have a region where the surface of the sapphire substrate 1 is exposed on the wafer to exhaust the generated gas. Further, it is preferable to form the exposing area like the street region 20s1 in at least one of four street regions 20s2 surrounding the rectangle chip region 2 in order to ease the effect of the generated gas for each element. It is more preferable to form the street region 20s1 in all the street regions 20s2 surrounding the rectangle chip region 2 in order to evenly exhaust the generated gas.

Moreover, the sapphire substrate may be processed in advance. FIGS. 14A to 14D are schematic cross sectional views of a semiconductor element for explaining a modified example of the embodiment.

Figure 14A:
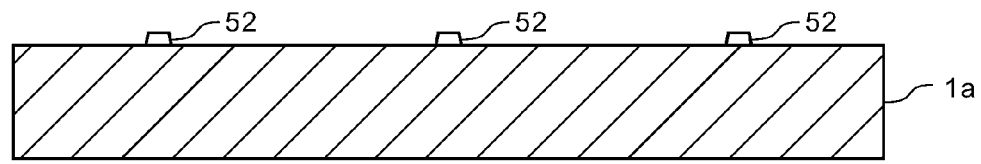
FIGS. 14A to 14D are schematic cross sectional views of a semiconductor element for explaining a manufacturing method according to the first modified example of the embodiment of the present invention.
Figure 14B:
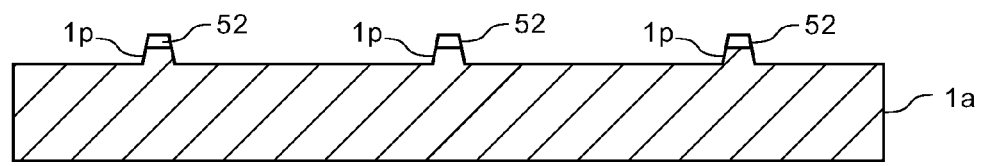
Figure 14C:
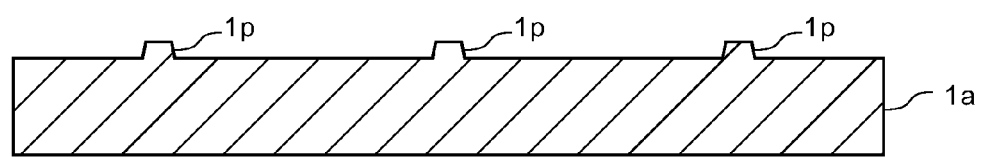

First, as shown in FIG. 14A, a resist pattern 52 is formed on a sapphire substrate 1a by photolithography or the like. Thereafter, as shown in FIG. 14B, a surface of the sapphire substrate 1a is partially dry-etched (gasses: BCl$_3$, Cl$_2$, Ar) by inductive coupled plasma reactive ion etching (ICP-RIE) to form bumps 1p with a height of about 1 μm on the surface of the sapphire substrate 1a. After forming the bumps 1p, the resist mask 52 is removed and the bumps 1p are left on the surface. Thereafter, the epitaxial layer (the buffer layer 10, the base GaN layer 11 and the semiconductor layer 20) is formed on the sapphire substrate 1a, the resist mask 51 having the openings corresponding to the street regions 20s2 with the width of M2 is formed as shown in FIG. 3A, and the semiconductor layers as shown in FIG. 14C can be obtained by etching the epitaxial layer until upper surfaces of the bumps 1p are exposed, that is, by etching the epitaxial layer until the thickness of the epitaxial layer becomes approximately same as the height of the bumps 1p (about 1 μm). Therefore, in this case, the first step of the two-step isolation process shown in FIGS. 2A and 2B can be omitted. It is preferable to agree the height of the bumps 1p with the thickness of the sacrificial layer 24 to be formed.

Moreover, the processed sapphire substrate 1a can be used in other way. FIGS. 15A to 15D are cross sectional views of a semiconductor element for explaining different use of the processed sapphire substrate 1a.

Figure 15A:
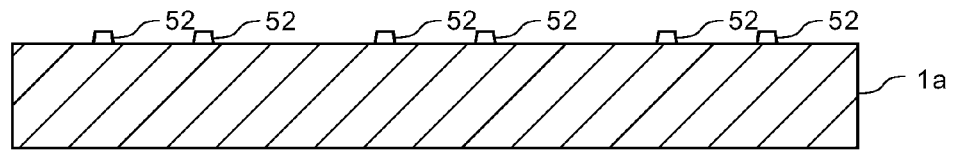
FIGS. 15A to 15D are schematic cross sectional views of a semiconductor element for explaining a manufacturing method according to the second modified example of the embodiment of the present invention.
Figure 15B:
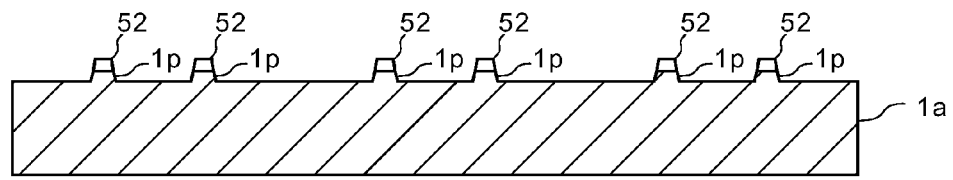
Figure 15C:
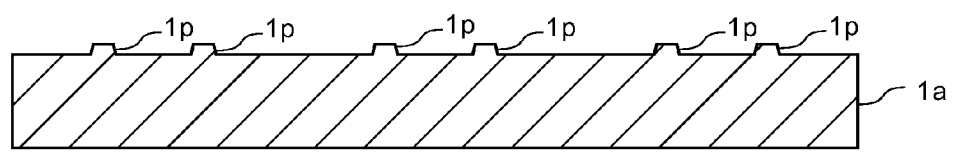

At the steps from FIG. 15A to FIG. 15C, similar to the steps shown in FIG. 14A to FIG. 14C, the bumps 1p are formed on the sapphire substrate 1a. Thereafter, the epitaxial layer (the buffer layer 10, the base GaN layer 11 and the semiconductor layer 20) is formed on the sapphire substrate 1a, and the LLO sacrificial layer 24 is formed as shown in FIG. 15D by performing the two-step etching process as shown in FIG. 2 and FIG. 3.

Figure 14D:
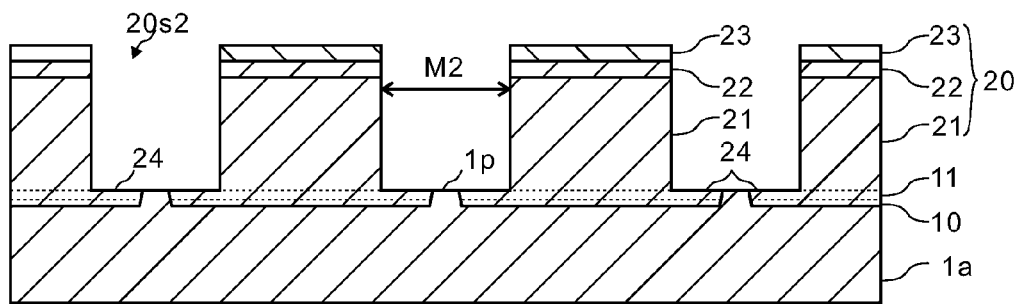
Figure 15D:
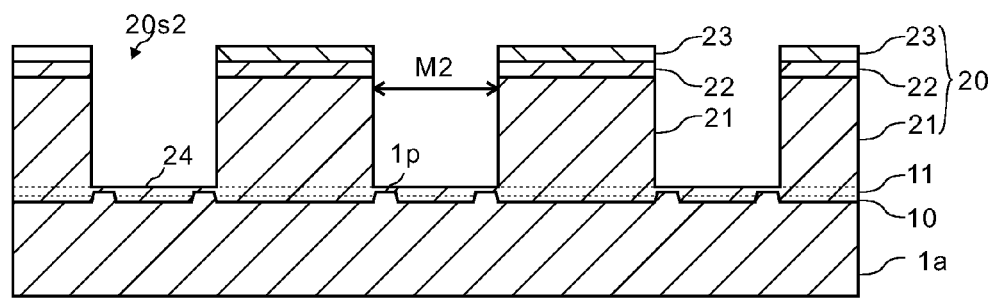

Different from the example shown in FIG. 14D, the epitaxial layer is not etched to expose the bumps 1p but the bumps 1p are covered by the remaining epitaxial layer and are left inside the LLO sacrificial layer 24 as shown in FIG. 15D. Each bump 1p is positioned near the boundary of the chip region 2 and the LLO sacrificial layer 24. Under this condition, the N2 gas generated by the LLO process first flows in the in-plane direction but generates stress upward after striking the bump 1p. The upward stress generated by the bumps 1p surely takes off the LLO sacrificial layer 24.

The present invention has been described in connection with the preferred embodiments. The invention is not limited only to the above embodiments. It is apparent that various modifications, improvements, combinations, and the like can be made by those skilled in the art.

What are claimed are:

1. A manufacturing method of a semiconductor element, comprising:

(a) preparing a growth substrate;
(b) forming a semiconductor layer on the growth substrate;
(c) dividing the semiconductor layer into a plurality of elements while leaving at least a part of the semiconductor layer between the elements to form a sacrificial layer around each element;
(d) forming a metal layer on the semiconductor layer;

(e) bonding a supporting substrate to the semiconductor layer via the metal layer; and (f) removing the growth substrate from the semiconductor layer by irradiating a laser whose area of irradiation covers each element within an outline of the sacrificial layer of each element;

wherein a width of the sacrificial layer is in a range of 10 to 20 μm.

2. The method of manufacturing a semiconductor device according to claim 1, wherein the step (c) comprises:

(c1) etching the semiconductor layer to form an isolation trench with a first width until a surface of the growth substrate is exposed in the isolation trench; and (c2) etching the semiconductor layer with a second width wider than the first width while leaving a region to be the sacrificial layer.

3. The method of manufacturing a semiconductor device according to claim 1, wherein a thickness of the sacrificial layer is not greater than one eighth of a thickness of the semiconductor layer.

4. The method of manufacturing a semiconductor device according to claim 1, wherein the laser is irradiated to at least an area inside a half of the width of the sacrificial layer at the step (f).

* * * * *